(12) United States Patent
Belady et al.

(10) Patent No.: US 7,403,396 B2
(45) Date of Patent: Jul. 22, 2008

(54) COMMUNICATING WITH AN ELECTRONIC MODULE THAT IS SLIDABLY MOUNTED IN A SYSTEM

(75) Inventors: Christian L. Belady, McKinney, TX (US); Eric C. Peterson, McKinney, TX (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 455 days.

(21) Appl. No.: 11/039,042

(22) Filed: Jan. 20, 2005

(65) Prior Publication Data

US 2006/0158833 A1 Jul. 20, 2006

(51) Int. Cl.
*H05K 5/00* (2006.01)
*H05K 7/00* (2006.01)
*G06F 1/16* (2006.01)
*A47B 97/00* (2006.01)

(52) U.S. Cl. ............. 361/727; 361/683; 361/686; 361/724; 361/725; 361/726; 312/223.2; 312/223.3

(58) Field of Classification Search .......... 361/679, 361/683, 686, 724–727; 312/223.2, 223.3
See application file for complete search history.

(56) References Cited

U.S. PATENT DOCUMENTS

| 4,818,054 | A | | 4/1989 | George et al. |
| 5,119,459 | A | | 6/1992 | Meyerhoefer et al. |
| 5,646,610 | A | * | 7/1997 | Trainor et al. ............... 370/254 |
| 5,842,313 | A | | 12/1998 | Murray et al. |
| 5,913,034 | A | * | 6/1999 | Malcolm .................. 709/223 |
| 5,999,295 | A | * | 12/1999 | Vowell et al. ............... 398/164 |
| 6,583,989 | B1 | * | 6/2003 | Guyer et al. ................ 361/724 |
| 2002/0171896 | A1 | * | 11/2002 | Clark et al. ................. 359/172 |
| 2005/0152337 | A1 | * | 7/2005 | Wurtzel et al. .............. 370/352 |

* cited by examiner

*Primary Examiner*—Lisa Lea-Edmonds
*Assistant Examiner*—Anthony M Haughton

(57) ABSTRACT

A system comprises an electronic module slidably mounted in the system, a first assembly including at least one wireless transceiver mounted in the system, and a second assembly including at least one wireless transceiver to communicate wirelessly with the wireless transceiver of the first assembly. The second assembly is attached to the electronic module, and the wireless transceivers of the first and second assemblies continue communicating as the electronic module is slidably moved in the system.

15 Claims, 5 Drawing Sheets

COMMUNICATING WITH AN ELECTRONIC MODULE THAT IS SLIDABLY MOUNTED IN A SYSTEM

BACKGROUND

Certain electronic systems, such as high-end computer server systems, storage server systems, telecommunications switch systems, and so forth, include a plurality of electronic modules, such as processing modules, storage modules, switch modules, and so forth. The multiple electronic modules are typically mounted inside a cabinet of the electronic system.

In a first type of computer server system, for example, the processing modules are electrically connected together by electrical wires. Each processing module can include a relatively large number of components, including multiple processors and other components. Consequently, there can be a relatively large number of electrical wires connecting the processing modules. Electrical wire management in computer server systems has become a major industry concern, as the amount of electrical wires present in the system affects the mechanical packaging of the computer server system.

If there are a large number of processing modules in the computer server system, then the relatively large number of electrical wires that have to be provided in the cabinet can become unwieldy. A high density of electrical wires inside the cabinet may result in reduced airflow within the cabinet, which may adversely affect the ability to cool components of each processing module. To further exacerbate the electrical wiring issue, extra lengths are often added to the electrical wires connected to the processing modules to enable sliding withdrawal of a processing module from a server cabinet for servicing. By making the electrical wires longer than necessary, a processing module can remain powered (and therefore available to users of a network environment, for example) even as the processing module is withdrawn from the server cabinet for servicing.

A second type of computer server system uses a backplane. Processing modules are electrically connected (by wires) to the backplane. The backplane is made up of interconnect circuitry to enable communication between the processing modules. Although the complexity of electrical wiring is reduced with this configuration, an issue of the second type of computer system is that it may be difficult to pull out a processing module for servicing without shutting down the processing module. To enable servicing of individual processing modules while the processing module remains live, relatively complicated solutions may often have to be employed, which add to the cost and complexity of the computer server system.

DETAILED DESCRIPTION

Figure 1:
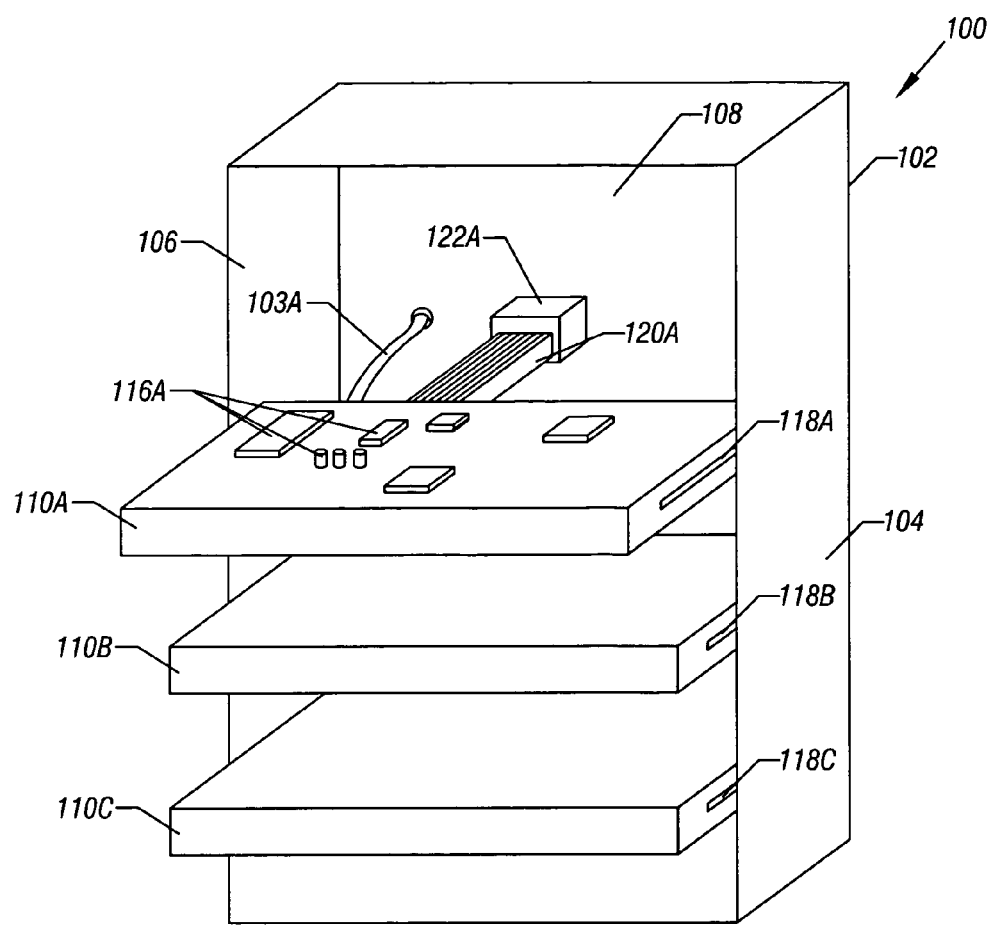
FIG. 1 illustrates a computer server system that includes slidably mounted processing modules according to an embodiment.
Figure 2:
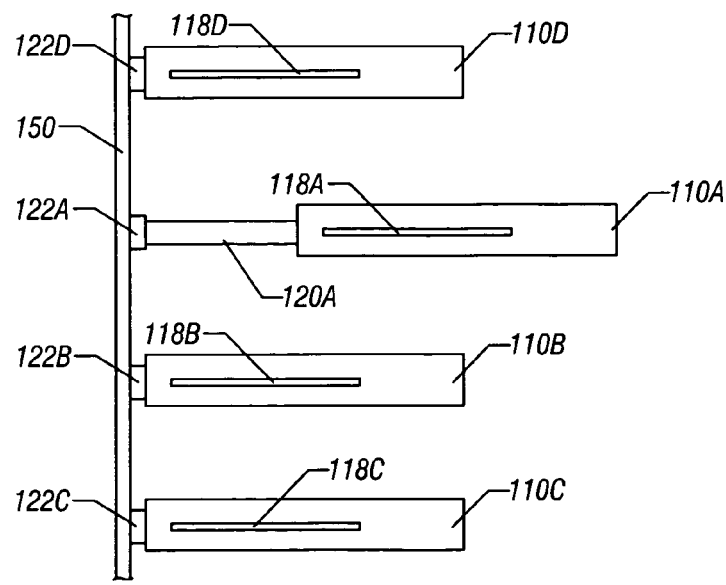
FIG. 2 is a side view of the processing modules in the computer server system of FIG. 1.

FIGS. 1 and 2 illustrate a computer server system 100 that has a cabinet 102 defined by side panels 104, 106, and a rear panel 108. A plurality of processing modules 110A, 110B, 110C, 110D (only 110A, 110B, 110C depicted in FIG. 1) are slidably mounted in the cabinet, within a chamber defined by the side panels 104, 106, and rear panel 108. The processing module 110A includes a sliding profile 118A to enable sliding engagement of the processing module 110A inside the cabinet 102. The sliding profile 118A is on the right side of the processing module 110A. Another sliding profile is provided on the left side of the processing module 110A. Similar sliding profiles 118B, 118C, 118D are provided on the other processing modules 110B, 110C, 110D. Although four processing modules are depicted in FIGS. 1-2, it is contemplated that different implementations can use different numbers of processing modules (one or greater). Also, in a different implementation, a different mounting mechanism can be used to mount each processing module in the cabinet 102.

Various components 116A are provided on a surface of the processing module 110A. Similar components are also mounted on the other processing modules 110B, 110C, 110D. Although some embodiments of the invention are described in the context of the computer server system 100, it is contemplated that embodiments can be incorporated into other types of electronic systems, such as storage server systems, telecommunication switch systems, and so forth. In such other electronic systems, the processing modules 110 are replaced with storage modules, switch modules, and so forth.

In accordance with some embodiments of the invention, instead of interconnecting each processing module 110 with electrical wires, wireless communication (optical wireless communication, electromagnetic wireless communication, and so forth) is performed between each processing module 110 and a backplane 150 (FIG. 2). In one embodiment, the wireless communication is performed through a guide assembly that includes a wireless communications conduit (e.g., 120A between processing module 110A and the backplane 150) connected to a head assembly (e.g., 122A connected to wireless communications conduit 120A). The head assembly 122A is connected to the backplane 150 (FIG. 2). The other processing modules 110B-110D are similarly slidably mounted to respective wireless communications conduits, which are in turn connected to respective head assemblies similar to head assembly 122A.

The backplane 150 can include electrical conductors (e.g., electrical wires, electrically conductive traces, etc.) for communication of power and signals. Alternatively, the backplane 150 can include structures to enable wireless communications over the backplane 150. Generally, the backplane 150 provides an interconnect structure that enables communications interconnection between the processing modules.

The head assembly 122A includes one or more wireless transceivers to communicate wireless signals through the wireless communications conduit 120A. Although not depicted in FIG. 1, the processing module 110A also has a head assembly that is slidably mounted to the wireless communications guide 120A to enable relative slidable movement of the processing module 110A with respect to the wireless communications conduit 120A.

The wireless communications conduit 120A is used to communicate control, address, and data signals with the processing module 110A. An electrical link 103A (such as a cable) is used to communicate power from the backplane 150 to the processing module 110A. Similar electrical cables are used to provide power to the other processing modules.

As depicted in FIGS. 1 and 2, the processing module 110A is in an extended position (the processing module 110A is pulled out from the chamber of the cabinet 102), whereas the processing modules 110B, 110C, and 110D are in a retracted position (the processing modules 110B, 110C, and 110D are positioned inside the chamber of the cabinet 102). Although the processing module 110A is in the extended position, the wireless communications conduit 120A enables continued wireless communications between the processing module 110A and the head assembly 122A such that operation of the processing module 110A can continue even though the processing module 110A is in the extended position.

By using the wireless communications conduits 120 according to some embodiments, wireless rather than wired signals are used for communication between the respective processing modules 110 and the backplane 150. Consequently, the large number of electrical wires typically found in conventional server cabinets is substantially reduced. The reduction of electrical wires allows more convenient manipulation (e.g., mounting, dismounting, etc.) of processing modules by users. Also, airflow inside the server cabinet is increased by reducing obstructions inside the cabinet, which helps in cooling components of the processing modules. A further benefit of the guide assembly that enables slidable movement of a processing module with respect to the wireless communications conduit is that the processing module can be maintained in an active state (powered and operational) while the processing module is withdrawn from the server cabinet for service.

Figure 3A:
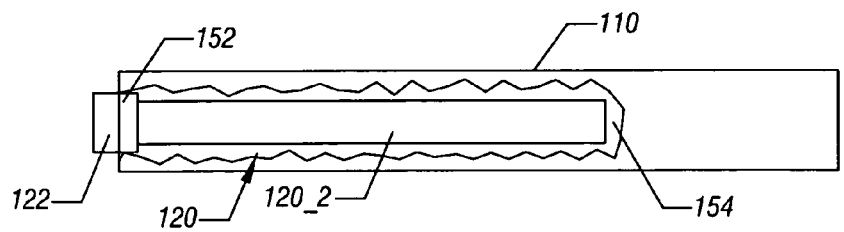
FIGS. 3A-3B illustrate a processing module slidably mounted, in accordance with an embodiment, to a guide assembly that includes a wireless communications conduit to communicate wireless signals between the processing module and a backplane of the computer server system.
Figure 3B:
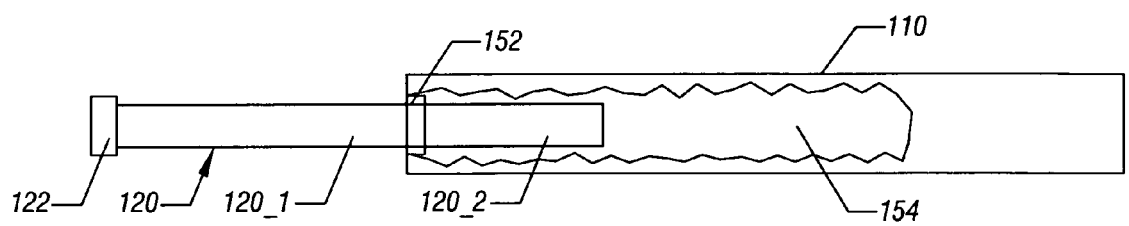

FIGS. 3A-3B depict a cutout portion of a processing module 110 to illustrate the portion of the guide assembly that is within the processing module 110. A head assembly 152 that is slidably mounted to the wireless communications conduit 120 is provided at a fixed position with respect to the processing module 110. In the example shown in FIGS. 3A-3B, the head assembly 152 is located inside the processing module 110. Alternatively, the head assembly 152 can be located outside the processing module 110, but attached to the processing module 110. In FIG. 3A, the processing module 110 is in its retracted position such that the head assemblies 122 and 152 are proximate each other (spaced apart by a first distance). Each of head assemblies 122 and 152 includes at least one wireless transceiver to communicate wirelessly with each other. In the retracted position of FIG. 3A, substantially the entire portion of the wireless communications conduit 120 is contained within the inner chamber 154 of the processing module 110. The portion of the wireless communications conduit 120 within the chamber 154 of the processing module 110 is labeled 120_2.

FIG. 3B depicts the processing module 110 in the extended position. In this position, the head assembly 152 has slid over a portion 120_1 of the wireless communications conduit 120 such that the portion 120_2 within the chamber of the processing module 110 is shorter than the portion 120_2 in FIG. 3A. The slidable movement of the head assembly 152 over the wireless communications conduit 120 causes the head assemblies 122 and 152 to be spaced apart by a second distance that is greater than the first distance (when the head assemblies are proximate each other). However, even though the head assemblies 122 and 152 are spaced apart by the length of the wireless communications conduit portion 120_1, the wireless transceivers of the head assemblies 122 and 152 are still capable of communicating with each other through the wireless communications conduit portion 120_1.

According to one embodiment, the wireless communications conduit 120 enables the communication of optical signals between optical transceivers in the head assemblies 122 and 152. In an alternative embodiment, instead of optical signals, the head assemblies 122 and 152 can include other types of wireless transceivers, such as radio frequency (RF) or other forms of electromagnetic (EM) transceivers for communicating other types of wireless signals.

Figure 4:
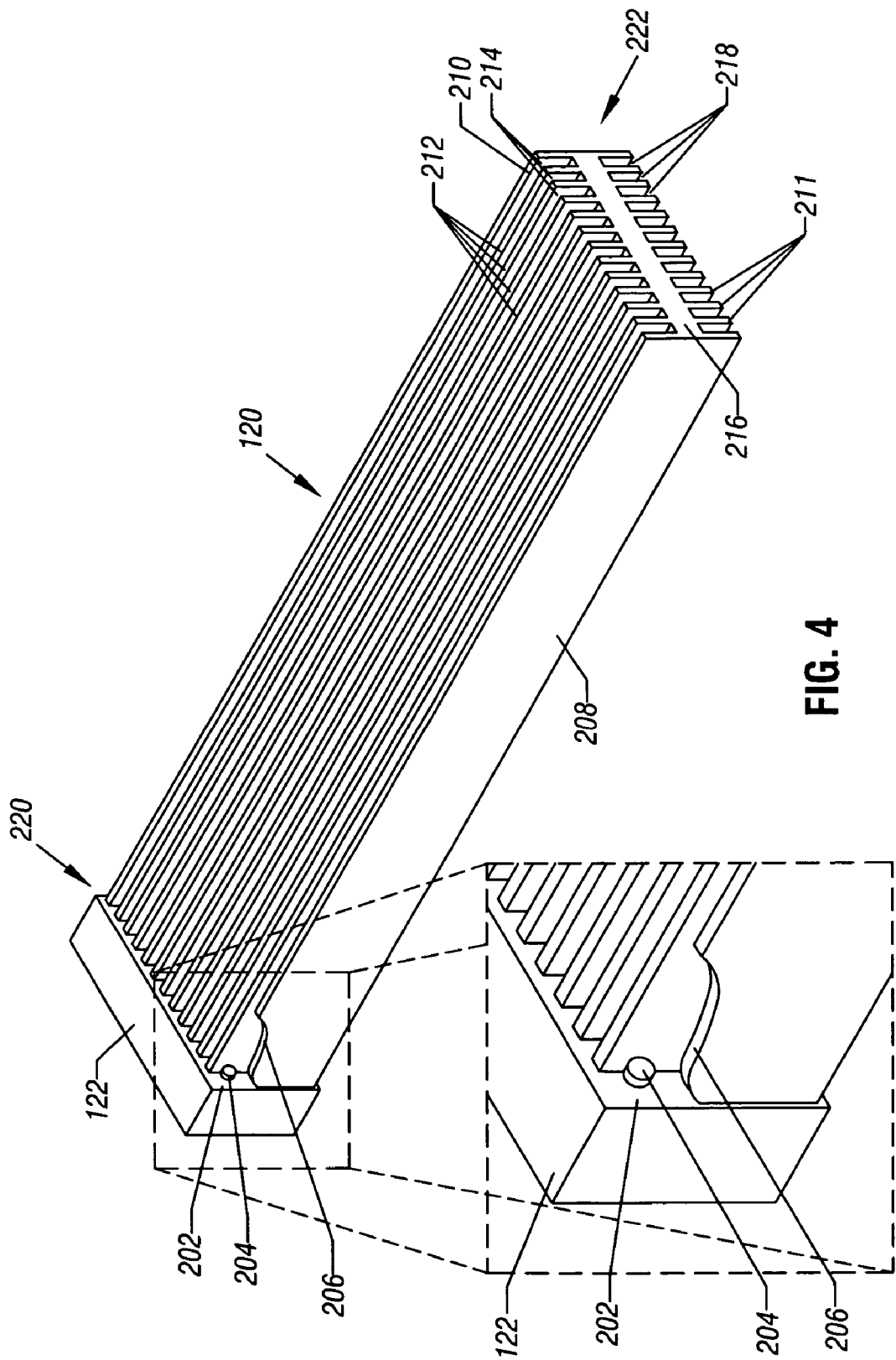
FIG. 4 is a perspective view of the guide assembly used in the computer server system of FIG. 1, according to an embodiment.

FIG. 4 shows a portion of the guide assembly described above in connection with FIGS. 1-3B. The guide assembly has a wireless communications conduit 120 with a first end 220 connected to the head assembly 122 and a second end 222 connected to the head assembly 152 (FIGS. 3A-3B). In the embodiment depicted in FIG. 4, the wireless communications conduit 120 has a plurality of channels 214, 218 along which wireless signals can be transferred. The channels 214 are defined by side walls 208 and 210 and intermediate dividers 212. The channels 214 are formed on one side of a central structure 216, whereas the channels 218 are formed on the other side of the central structure 216. The channels 218 are defined by the side walls 208, 210 and intermediate dividers 211. In the optical communication embodiment, the channels 214, 218 are used to guide optical signals between respective optical transceivers in the head assemblies 122, 152.

In alternative embodiments, the wireless signals can be communicated between transceivers in the head assemblies 122 and 152 without the use of channels. In yet another embodiment, the channels can be completely covered on all four sides to provide better shielding of signals communicated through the channels. Other types and shapes of channels can also be used in other embodiments.

A portion of the side wall 208 has been cut away (indicated by 206) to depict a wireless transceiver 204 mounted to a surface 202 of the head assembly 122. In one embodiment, the transceiver 204 is an optical transceiver to transmit and receive optical signals along a corresponding channel 214, 218. Thus, in the embodiment depicted in FIG. 4, each channel 214, 218 is associated with a corresponding wireless transceiver 204 mounted to the head assembly 122.

Figure 5:
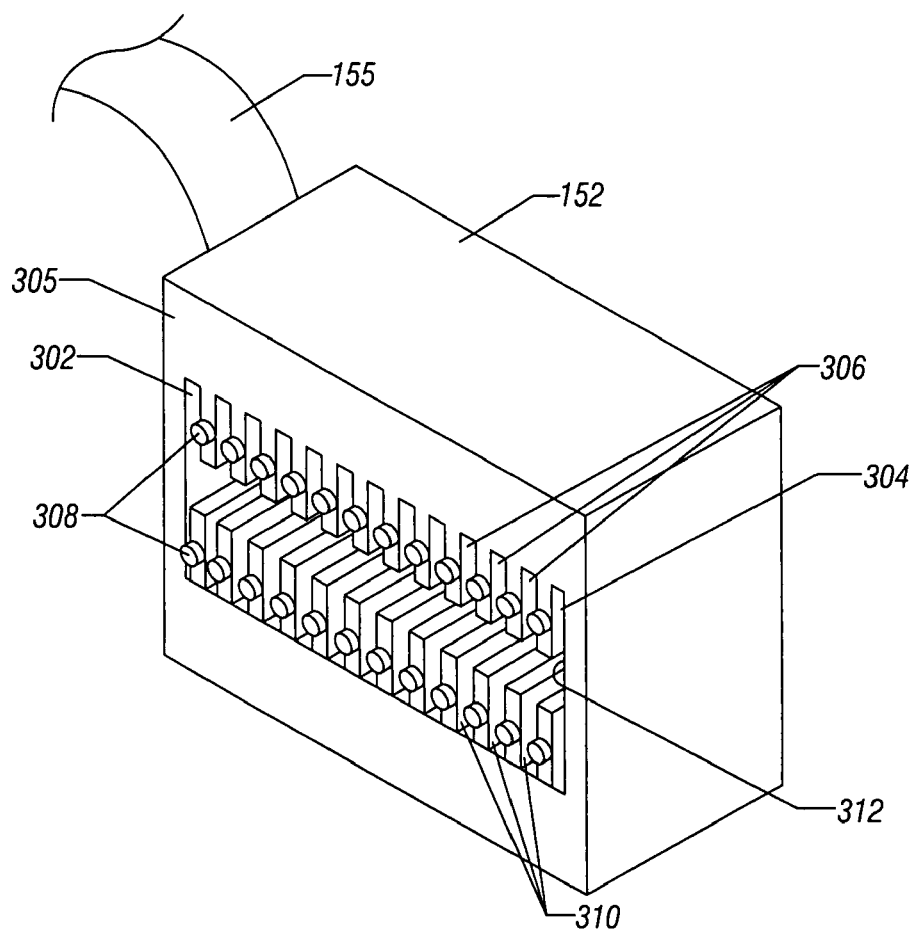
FIG. 5 is a head assembly that is slidably engageable with the guide assembly of FIG. 4, according to an embodiment.

Similarly, as depicted in FIG. 5, corresponding wireless transceivers 308 are mounted to a surface 305 of the head assembly 152 for communicating wireless signals across corresponding channels 214, 218 (FIG. 4) of the wireless communications conduit 120 with corresponding wireless transceivers 204 mounted to the head assembly 122.

The head assembly 152 (attached to the processing module 110 as depicted in FIGS. 3A-3B) has end slots 302 and 304 through which side walls 210 and 208 (FIG. 4) of the wireless communications conduit 120 are able to pass. Also, the head assembly 152 has additional intermediate slots 306 and 310 to receive respective dividers 214 and 211. A central opening 312 is provided to receive the central structure 216 (FIG. 4) of the wireless communications conduit 120. The slots 302, 304, 306, 310 and the central opening 312 enable slidable engagement between the head assembly 152 and the wireless communications conduit 120, such that the head assembly 152 and the wireless communications conduit 120 are slidable with respect to each other along the length of the wireless communications conduit 120 (as depicted in FIGS. 3A-3B). During sliding movement of the head assembly 152 with respect to the wireless communications conduit 120, the wireless transceivers 308 can continue to communicate with corresponding wireless transceivers 204 at the head assembly 122 on the other end of the guide assembly.

In a different embodiment, the positions of the head assemblies 122 and 152 can be switched with the head assembly 122 attached to the processing module and the head assembly 152 connected to the backplane.

The head assembly 152 includes converters (not shown) to convert between optical signals and electrical signals that are provided through a cable 155. The cable 155 has multiple electrical wires or circuits for communicating corresponding electrical signals to electrical components of the processing module 110.

Figure 6:
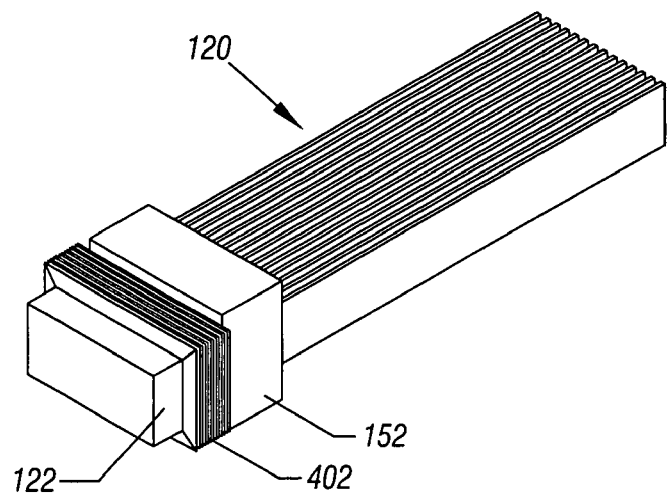
FIG. 6 illustrates an alternative embodiment of an arrangement of the guide assembly cooperatively coupled to a head assembly by an expandable boot, where the expandable boot is in an undeployed state.

Another embodiment of the guide assembly is depicted in FIG. 6, where an expandable boot 402 is connected between the head assemblies 122 and 152. FIG. 6 shows the expandable boot in an undeployed state (the state associated with the head assemblies 122 and 152 being proximate each other when the processing module 110 is in its retracted state within the server cabinet 102). The expandable boot 402 provides a dust cover to prevent dust or other particles from entering the channels of the wireless communications conduit 120.

Figure 7:
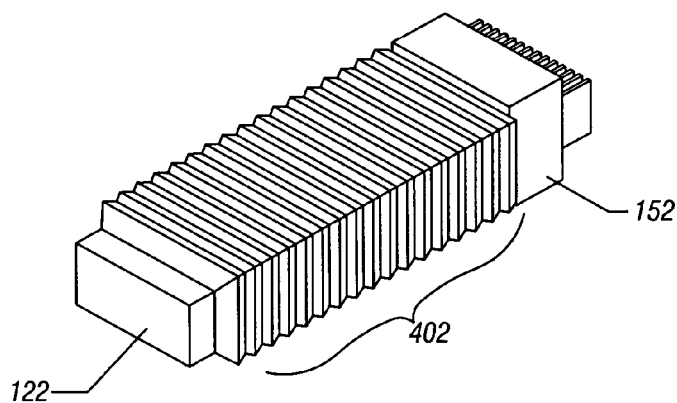
FIG. 7 illustrates the arrangement of FIG. 6 with the expandable boot in a deployed state.

FIG. 7 shows the guide assembly of FIG. 6 in its deployed state, where the head assemblies 122 and 152 are spaced apart when the processing module 110 is in the extended position (withdrawn from the server cabinet 102). The expandable boot 402 is in its expanded state.

In alternative embodiments, for more convenient manipulation by the user of the processing module 110 as the processing module 110 is withdrawn from or retracted back into the server cabinet 102, the connection between the wireless communications conduit 120 and the head assembly 122 and/or 152 can be hinged such that a slight amount of pivoting can occur between the head assembly 122 and/or 152 and the wireless communications conduit 120.

Figure 8:
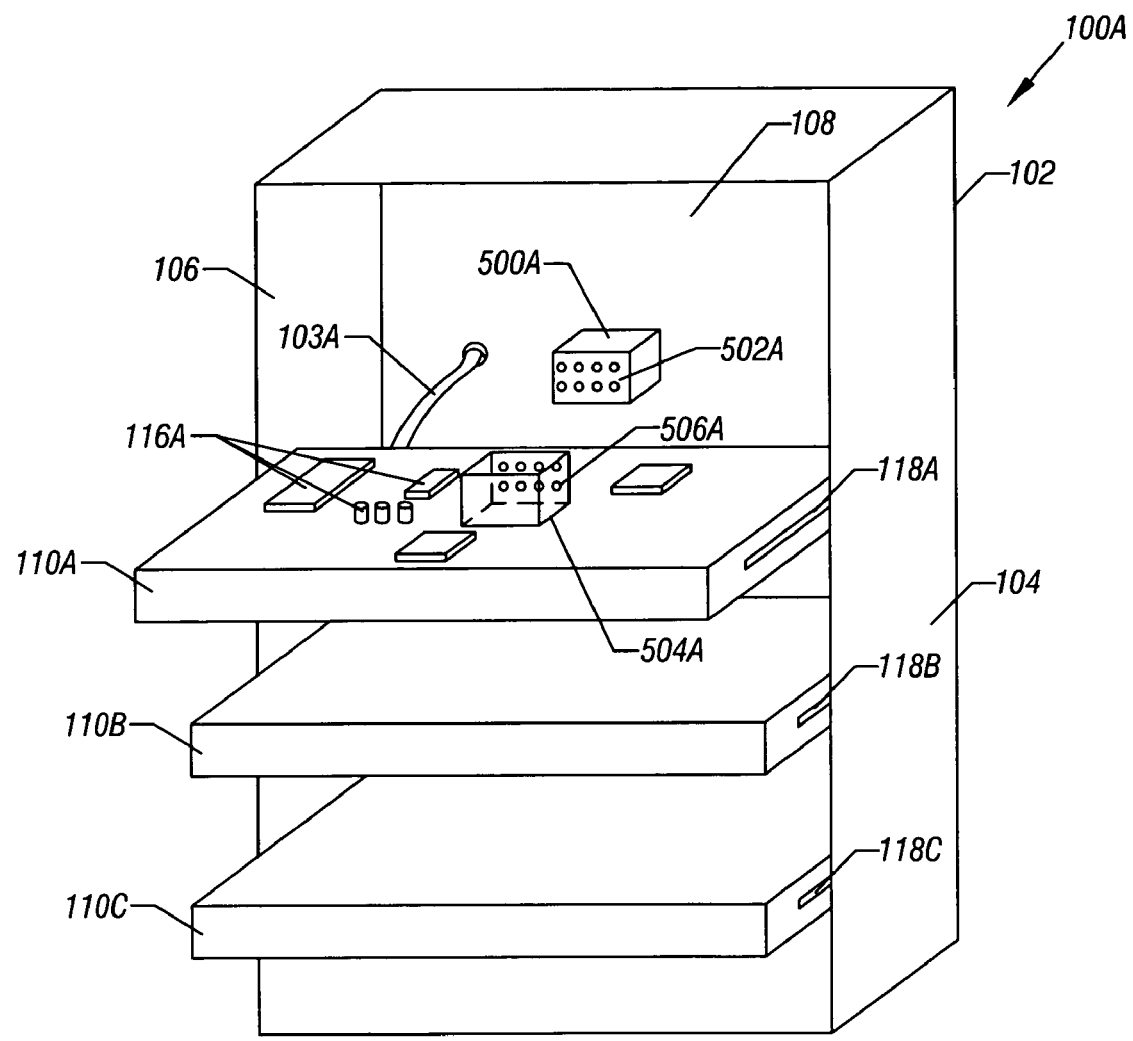
FIG. 8 illustrates a computer server system that includes slidably mounted processing modules according to another embodiment.

FIG. 8 shows another embodiment of the computer server system 100A, which is identical to the computer server system 100 of FIG. 1 except that a guide assembly including a wireless communications conduit 120 is omitted in the FIG. 8 embodiment. A first head assembly 500 is fixedly mounted in the server cabinet 102, such as to the backplane 150 (FIG. 2). The first head assembly 500A has plural wireless transceivers 502A (e.g., optical transceivers, electromagnetic transceivers, etc.). A second head assembly 504A is attached to the processing module 110A. The second head assembly 504A has plural transceivers 506A. The wireless transceivers 504A and 506A communicate with each other through free space across the distance between each pair of wireless transceivers 504A and 506A. Each pair of wireless transceivers 504A, 506A are aligned so that they can continue to communicate with each other even as the processing module 110A is moved between an extended position (withdrawn from server cabinet 102) and a retracted position (located inside server cabinet 102). Depending on the criticality of the alignment, alignment can be done by limiting tolerances or other self-aligning techniques.

Additional pairs of head assemblies 500, 504 are provided for the other processing modules 110B, 110C shown in FIG. 8.

In the foregoing description, numerous details are set forth to provide an understanding of the present invention. However, it will be understood by those skilled in the art that the present invention may be practiced without these details.

While the invention has been disclosed with respect to a limited number of embodiments, those skilled in the art will appreciate numerous modifications and variations therefrom. It is intended that the appended claims cover such modifications and variations as fall within the true spirit and scope of the invention.

What is claimed is:

1. A system comprising:
   an electronic module;
   a wireless communications conduit slidably connected to the electronic module, the wireless communications conduit having plural channels to transfer respective optical signals through the wireless communications conduit to the electronic module,
   wherein the electronic module is slidable along the wireless communications conduit between at least two positions;
   a first assembly connected to the wireless communications conduit, the first assembly having plural optical transceivers to communicate the optical signals along the respective plural channels; and
   a second assembly that is part of the electronic module,
   wherein the wireless communications conduit has side walls and dividers to define the plural channels, and wherein the second assembly has slots to slidably receive the side walls and dividers of the wireless communications conduit.

2. The system of claim 1, wherein the electronic module has an inner chamber to receive a portion of the wireless communications conduit as the second assembly slides over the wireless communications conduit.

3. The system of claim 1, wherein the electronic module is slidable between a first position where the first and second assemblies are proximate each other, and a second position where the first and second assemblies are spaced apart from each other.

4. A method comprising:
   mounting an electronic module in a cabinet, the electronic module slidably mounted in the cabinet to enable movement between at least a first position and second position;
   attaching a first assembly to the electronic module, the first assembly having a first wireless transceiver;
   mounting a second assembly in the cabinet, the second assembly having a second wireless transceiver to communicate wirelessly with the first wireless transceiver over a wireless communications conduit; and
   moving the electronic module between the first position and the second position by sliding the first assembly along the wireless communications conduit, wherein the first assembly has first structures that are engaged with second structures of the wireless communications conduit as the first assembly slides along the wireless communications conduit,
   wherein the first and second wireless transceivers remain in wireless communication as the electronic module is moved between the first and second positions.

5. The method of claim 4, wherein moving the electronic module between the first position and the second position comprises moving the electronic module between a fully retracted position where the electronic module is contained inside the cabinet, and an extended position where the electronic module protrudes at least partially from the cabinet to enable access to the electronic module, the method further comprising the first and second wireless transceivers remaining in wireless communication when the electronic module is in the fully retracted position.

6. The method of claim 4, wherein communicating wirelessly over the wireless communications conduit comprises communicating wirelessly over an optical communications conduit between the first and second wireless transceivers.

7. The method of claim 4, wherein moving the electronic module between the first and second positions comprises moving the electronic module between a position where the first and second assemblies are spaced apart by a first distance, and another position where the first and second assemblies are spaced apart by a second, greater distance.

8. A system comprising:
an electronic module slidably mounted in the system;
a first assembly including at least one wireless transceiver mounted in the system;
a second assembly including at least one wireless transceiver to communicate wirelessly with the wireless transceiver of the first assembly,
the second assembly attached to the electronic module; and
a wireless communications conduit provided between the first and second assemblies, wherein wireless signals communicated between the wireless transceivers of the first and second assemblies are transmitted through the wireless communications conduit,
the wireless transceivers of the first and second assemblies to continue communicating as the electronic module is slidably moved in the system, and
at least a portion of the wireless communications conduit is received inside an inner chamber of the electronic module as the electronic module is slidably retracted into the system,
wherein the second assembly has slots, and wherein the wireless communications conduit has dividers to define channels for communicating the wireless signals, the slots of the second assembly to receive the dividers to enable the second assembly to slide along the wireless communications conduit.

9. The system of claim 8, further comprising a cabinet, the electronic module slidably mounted in the cabinet, and the first assembly mounted in the cabinet.

10. The system of claim 8, wherein the transceivers comprise optical transceivers.

11. An apparatus to enable wireless communication between an electronic module and an interconnect structure, comprising:
a wireless communications conduit;
a first assembly connected to the interconnect structure and the wireless communications conduit, wherein the first assembly has at least a first wireless transceiver; and
a second assembly for attachment to the electronic module, the second assembly slidably mounted on the wireless communications conduit, wherein the second assembly has at least a second wireless transceiver to communicate wirelessly with the first wireless transceiver over the wireless communications conduit,
wherein the wireless communications conduit has dividers to define channels for communicating wireless signals between the first and second wireless transceivers, and
wherein the second assembly has slots to receive the dividers to enable sliding movement of the second assembly along the wireless communications conduit.

12. The apparatus of claim 11, wherein the first and second wireless transceivers comprise first and second optical transceivers.

13. The apparatus of claim 11, wherein the first assembly has plural first wireless transceivers, and the second assembly has plural second wireless transceivers, wherein the first wireless transceivers are adapted to communicate wirelessly with respective second wireless transceivers over the wireless communications conduit.

14. The apparatus of claim 11, wherein the second assembly is slidable over the wireless communications conduit between a first position and a second position, wherein at the first position the first and second assemblies are spaced apart by a first distance, and wherein at the second position the first and second assemblies are spaced apart by a second, greater distance.

15. The apparatus of claim 14, wherein the first and second wireless transceivers continue to communicate wirelessly as the second assembly is moved between the first and second positions.

* * * * *